(12) United States Patent
Beppu

(10) Patent No.: US 11,211,521 B2
(45) Date of Patent: Dec. 28, 2021

(54) METHOD OF MANUFACTURING LIGHT-EMITTING DEVICE INCLUDING PHOSPHOR PIECES

(71) Applicant: NICHIA CORPORATION, Anan (JP)

(72) Inventor: Suguru Beppu, Anan (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 16/897,443

(22) Filed: Jun. 10, 2020

(65) Prior Publication Data

US 2020/0395502 A1 Dec. 17, 2020

(30) Foreign Application Priority Data

Jun. 17, 2019 (JP) .............................. JP2019-111831

(51) Int. Cl.
| | | |
|---|---|---|
| *H01L 33/00* | | (2010.01) |
| *H01L 21/66* | | (2006.01) |
| *H01L 33/50* | | (2010.01) |

(52) U.S. Cl.
CPC .......... *H01L 33/0062* (2013.01); *H01L 22/12* (2013.01); *H01L 33/504* (2013.01)

(58) Field of Classification Search
CPC ... H01L 33/0062; H01L 22/12; H01L 33/504; H01L 25/0753; H01L 33/505; H01L 2933/0041; H01L 22/20
USPC ......................................................... 438/22
See application file for complete search history.

(56) References Cited

U.S. PATENT DOCUMENTS

| | | | | |
|---|---|---|---|---|
| 7,446,343 | B2 * | 11/2008 | Mueller ................. | C04B 35/01 257/88 |
| 8,552,448 | B2 * | 10/2013 | Ichikawa .............. | H01L 33/502 257/98 |
| 2005/0274967 | A1 | 12/2005 | Martin et al. | |
| 2007/0215890 | A1 * | 9/2007 | Harbers ............. | C09K 11/7774 257/98 |
| 2008/0048200 | A1 * | 2/2008 | Mueller ................. | B29C 41/20 257/98 |
| 2009/0212697 | A1 | 8/2009 | Nakamura et al. | |
| 2011/0297987 | A1 | 12/2011 | Koizumi et al. | |

(Continued)

FOREIGN PATENT DOCUMENTS

| | | |
|---|---|---|
| JP | 2003-46124 A | 2/2003 |
| JP | 2006-37097 A | 2/2006 |

(Continued)

*Primary Examiner* — Duy T Nguyen
(74) *Attorney, Agent, or Firm* — Birch, Stewart, Kolasch & Birch, LLP

(57) ABSTRACT

A method of manufacturing a light-emitting device 1 includes a step of providing first phosphor sheets 11, a step of providing second phosphor sheets 12, a step of providing a light-emitting element 13, a selection step of selecting a combination of one of the first phosphor sheets 11 and one of the second phosphor sheets 12 on the basis of a wavelength conversion characteristic of each of the first phosphor sheets 11 and a wavelength conversion characteristic of each of the second phosphor sheets 12, a step of obtaining a plurality of first phosphor pieces 11c and a plurality of second phosphor pieces 12c from the selected first phosphor sheet 11 and the selected second phosphor sheet 12, and a step of disposing one of the first phosphor pieces 11c and one of the second phosphor pieces 12c on or above the light-emitting element 13.

14 Claims, 13 Drawing Sheets

(56) References Cited

U.S. PATENT DOCUMENTS

| | | | |
|---|---|---|---|
| 2014/0285997 A1* | 9/2014 | Nitta | C09K 11/592 |
| | | | 362/84 |
| 2015/0340547 A1 | 11/2015 | Tamaki | |
| 2016/0115384 A1* | 4/2016 | Todorov | H05B 33/12 |
| | | | 313/503 |
| 2017/0294561 A1 | 10/2017 | Ikeda et al. | |
| 2018/0287019 A1* | 10/2018 | Hashimoto | H01L 33/60 |
| 2018/0346808 A1* | 12/2018 | Nitta | C09K 11/7769 |

FOREIGN PATENT DOCUMENTS

| | | |
|---|---|---|
| JP | 2007-80862 A | 3/2007 |
| JP | 2007-273998 A | 10/2007 |
| JP | 2011-513898 A | 4/2011 |
| JP | 2011-102004 A | 5/2011 |
| JP | 2011-258675 A | 12/2011 |
| JP | 2012-74739 A | 4/2012 |
| JP | 2014-22704 A | 2/2014 |
| JP | 2015-179719 A | 10/2015 |
| JP | 2016-1735 A | 1/2016 |
| JP | 2017-188592 A | 10/2017 |
| JP | 2017-211590 A | 11/2017 |
| JP | 2018-166197 A | 10/2018 |
| JP | 2018-174251 A | 11/2018 |
| JP | 2018-191015 A | 11/2018 |
| JP | 2019-145259 A | 8/2019 |
| WO | WO 2009/105581 A1 | 8/2009 |
| WO | WO 2015/041204 A1 | 3/2015 |

\* cited by examiner

METHOD OF MANUFACTURING LIGHT-EMITTING DEVICE INCLUDING PHOSPHOR PIECES

CROSS-REFERENCE TO RELATED APPLICATIONS

This application is based upon and claims the benefit of priority from the prior Japanese Patent Application No. 2019-111831, filed on Jun. 17, 2019; the entire contents of which are incorporated herein by reference.

FIELD

Embodiments relate to a method of manufacturing a light-emitting device.

BACKGROUND

Light-emitting devices employing combinations of light-emitting elements and phosphor sheets have been developed in recent years. For example, a light-emitting device that emits white light as a whole can be provided by disposing, on a light-emitting element that emits blue light, a phosphor sheet that absorbs blue light to emit green light and a phosphor sheet that absorbs blue light to emit red light in layers. Characteristics of light emitted from such a light-emitting device may vary due to variation in characteristics of the phosphor sheets.

SUMMARY

A method of manufacturing a light-emitting device according to one embodiment of the present invention includes: providing a plurality of first phosphor sheets; providing a plurality of second phosphor sheets; providing a light-emitting element; selecting a combination of one of the first phosphor sheets and one of the second phosphor sheets on the basis of a wavelength conversion characteristic of each of the first phosphor sheets and a wavelength conversion characteristic of each of the second phosphor sheets, a step of obtaining a plurality of first phosphor pieces and a plurality of second phosphor pieces from the selected first phosphor sheet and the selected second phosphor sheet; and disposing one of the first phosphor pieces and one of the second phosphor pieces on or above the light-emitting element.

A method of manufacturing a light-emitting device according to another embodiment of the present invention includes: providing a plurality of first phosphor sheets; providing a plurality of second phosphor sheets; providing a plurality of light-emitting elements; selecting a combination of one of the first phosphor sheets and one of the second phosphor sheets on the basis of a wavelength conversion characteristic of each of the first phosphor sheets and a wavelength conversion characteristic of each of the second phosphor sheets; disposing the plurality of light-emitting elements on or above a layered sheet in which the selected first phosphor sheet and the selected second phosphor sheet are layered; and dividing the layered sheet.

A method of manufacturing a light-emitting device according to still another embodiment of the present invention includes: providing a plurality of first phosphor sheets; providing a plurality of second phosphor sheets; providing a light-emitting element; selecting a combination of one of the first phosphor sheets and one of the second phosphor sheets on the basis of a wavelength conversion characteristic of each of the first phosphor sheets and a wavelength conversion characteristic of each of the second phosphor sheets; and disposing the selected first phosphor sheet and the selected second phosphor sheet at a position capable of receiving light emitted from the light-emitting element.

DETAILED DESCRIPTION OF EMBODIMENTS

Embodiments of the present invention and their modified examples will be described below. In the embodiments and their modified examples other than a first embodiment, only features different from the features of the first embodiment will be generally described, and other constitutions, effects are substantially the same as in the first embodiment. The embodiments and the modified examples can be combined with one another. Further, drawings used for description are schematic and simplified as appropriate.

First Embodiment

Figure 1:
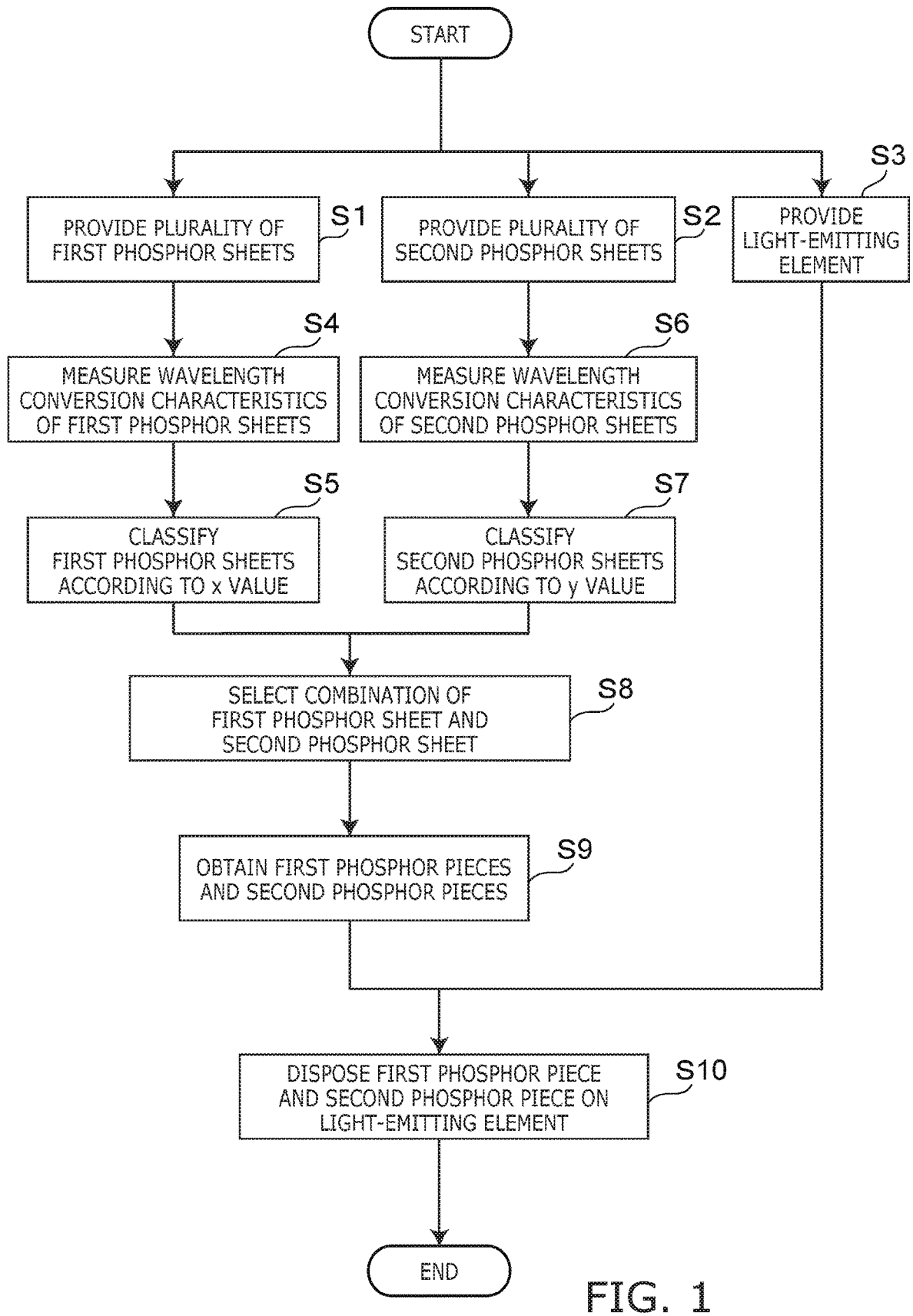
FIG. 1 is a flowchart of a method of manufacturing a light-emitting device according to a first embodiment.

FIG. 1 is a flowchart of a method of manufacturing a light-emitting device according to the present embodiment.

Figure 2A:
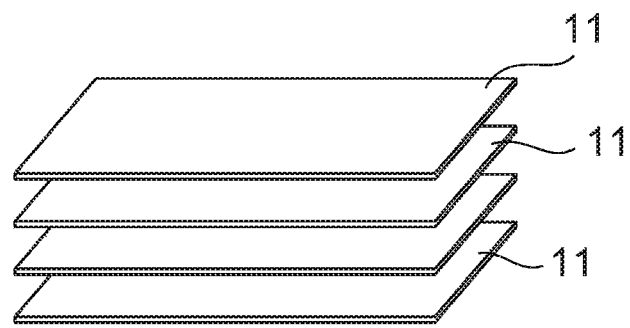
FIG. 2A is a schematic perspective view of first phosphor sheets used in the first embodiment.
Figure 2B:
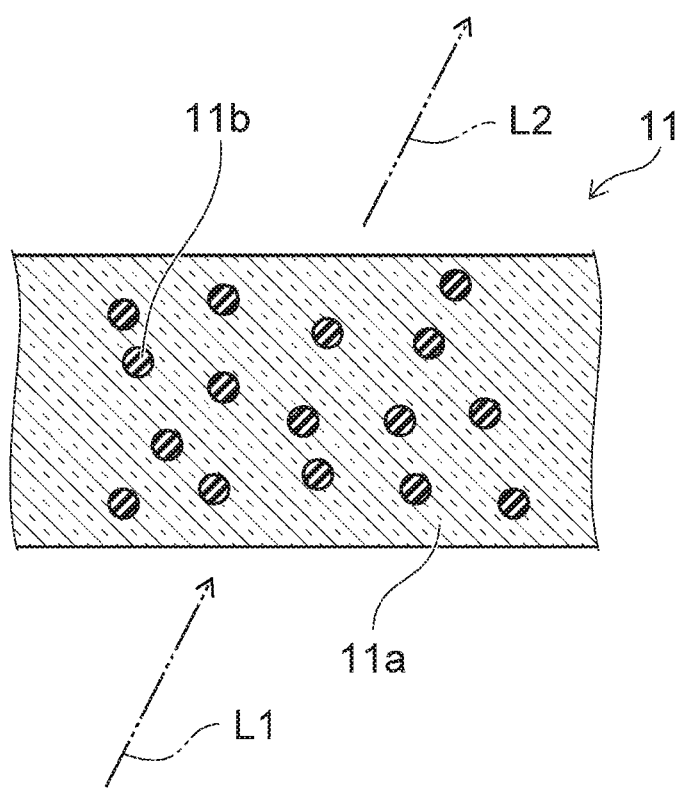
FIG. 2B is a schematic cross-sectional view of one of the first phosphor sheets used in the first embodiment.

FIG. 2A is a schematic perspective view of first phosphor sheets used in the present embodiment, and FIG. 2B is a schematic cross-sectional view of one of the first phosphor sheets.

Figure 3A:
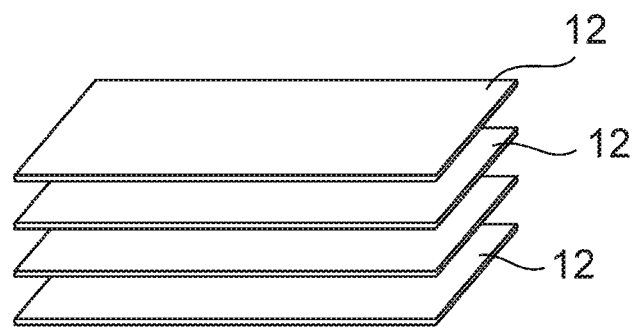
FIG. 3A is a schematic perspective view of second phosphor sheets used in the first embodiment.
Figure 3B:
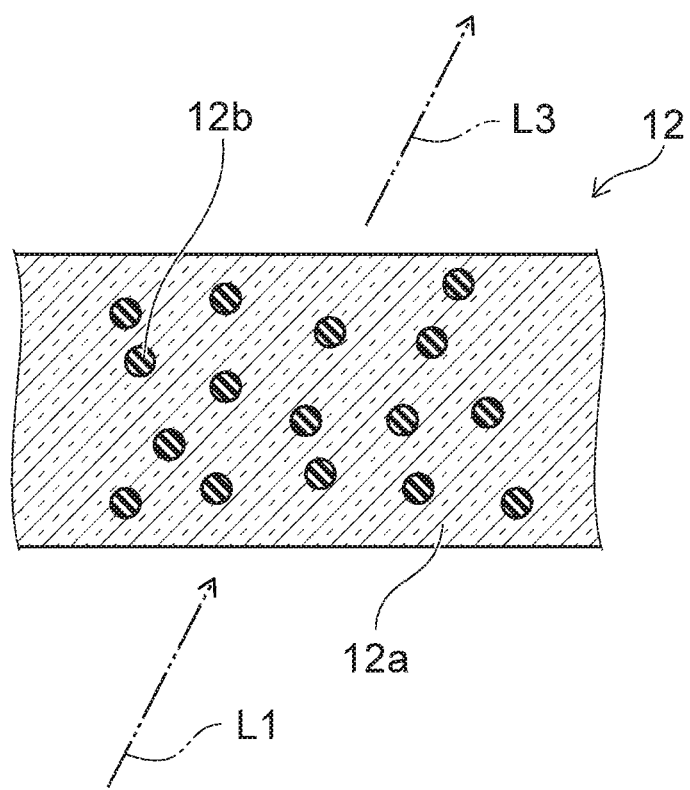
FIG. 3B is a schematic cross-sectional view of one of the second phosphor sheets used in the first embodiment.

FIG. 3A is a schematic perspective view of second phosphor sheets used in the present embodiment, and FIG. 3B is a schematic cross-sectional view of one of the second phosphor sheets.

Figure 4A:
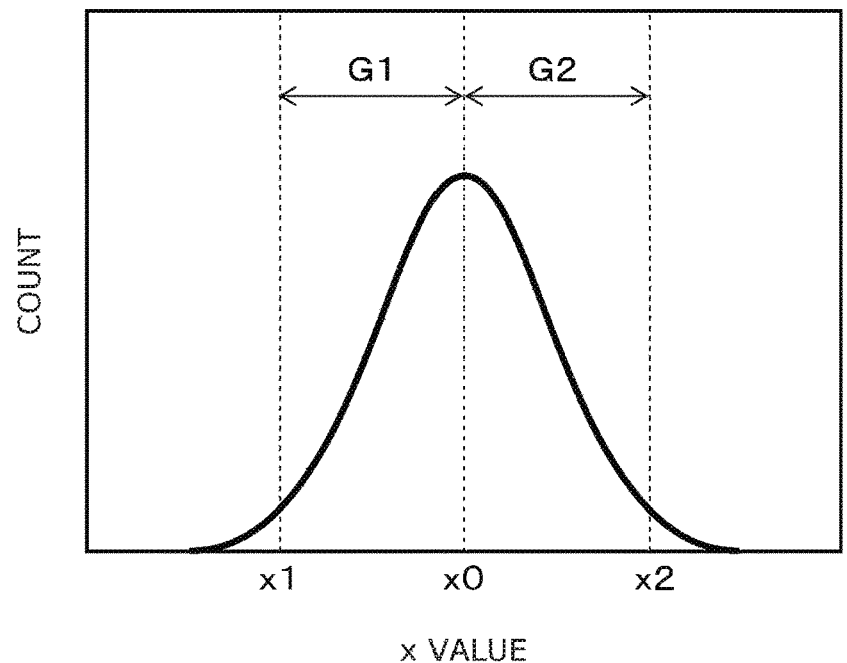
FIG. 4A is a graph which shows a method of classifying the first phosphor sheets according to x value, and in which the horizontal axis shows x value of xy chromaticities, and the vertical axis shows count.
Figure 4B:
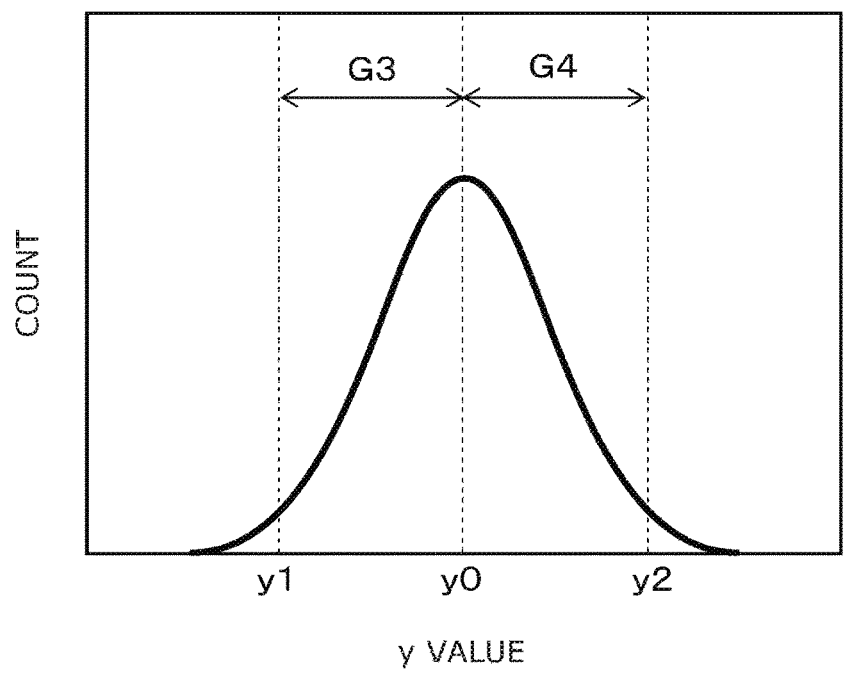
FIG. 4B is a graph which shows a method of classifying the second phosphor sheets according to y value, and in which the horizontal axis shows y value of xy chromaticities, and the vertical axis shows count.

FIG. 4A is a graph which shows a method of classifying the first phosphor sheets according to x value, and in which the horizontal axis shows x value of xy chromaticities, and the vertical axis shows count. FIG. 4B is a graph which shows a method of classifying the second phosphor sheets according to y value, and in which the horizontal axis shows y value of xy chromaticities, and the vertical axis shows count.

Figure 5A:
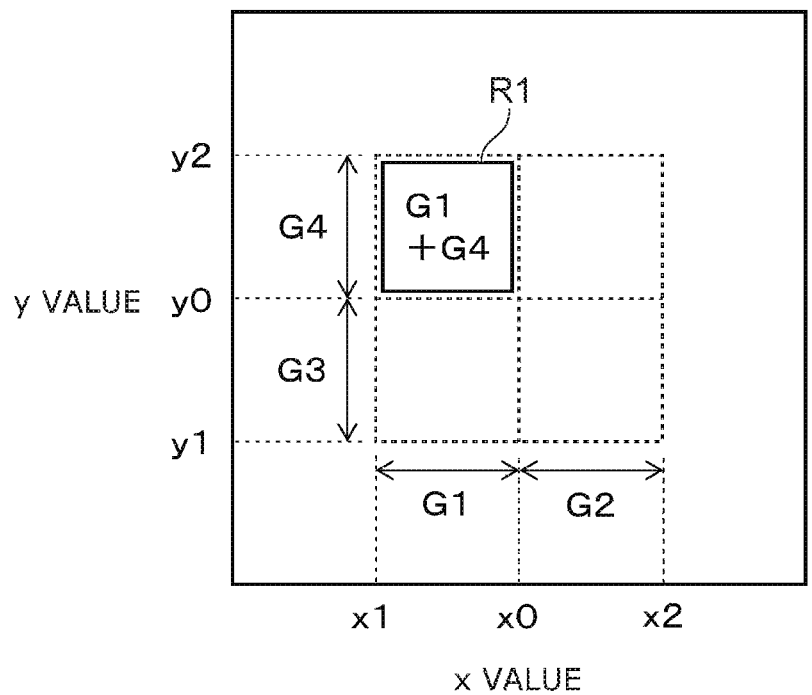
FIG. 5A is an xy chromaticity diagram for a method of selecting the first phosphor sheet and the second phosphor sheet in the first embodiment.
Figure 5B:
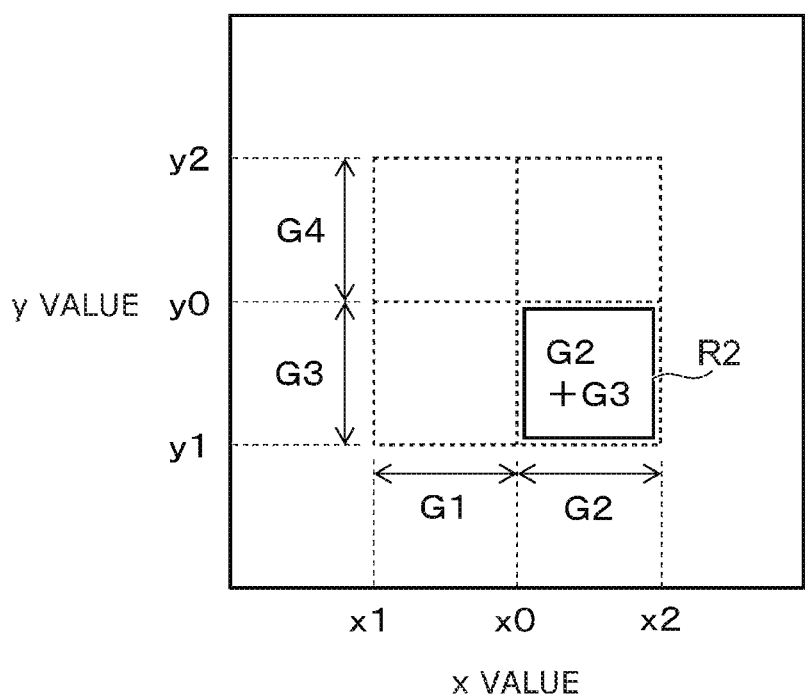
FIG. 5B is an xy chromaticity diagram for the method of selecting the first phosphor sheet and the second phosphor sheet in the first embodiment.

FIG. 5A and FIG. 5B are xy chromaticity diagrams for a method of selecting the first phosphor sheet and the second phosphor sheet in the present embodiment.

Figure 6:
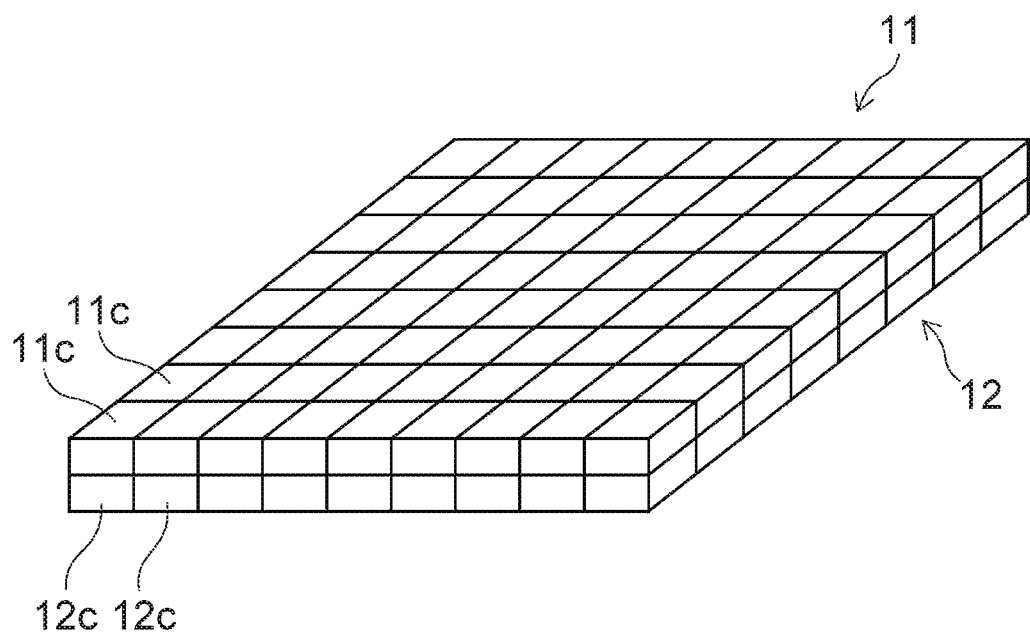
FIG. 6 schematically shows a step of obtaining first phosphor pieces and second phosphor pieces from the first phosphor sheet and the second phosphor sheet.

FIG. 6 schematically shows a step of obtaining first phosphor pieces and second phosphor pieces from the first phosphor sheet and the second phosphor sheet.

Figure 7:
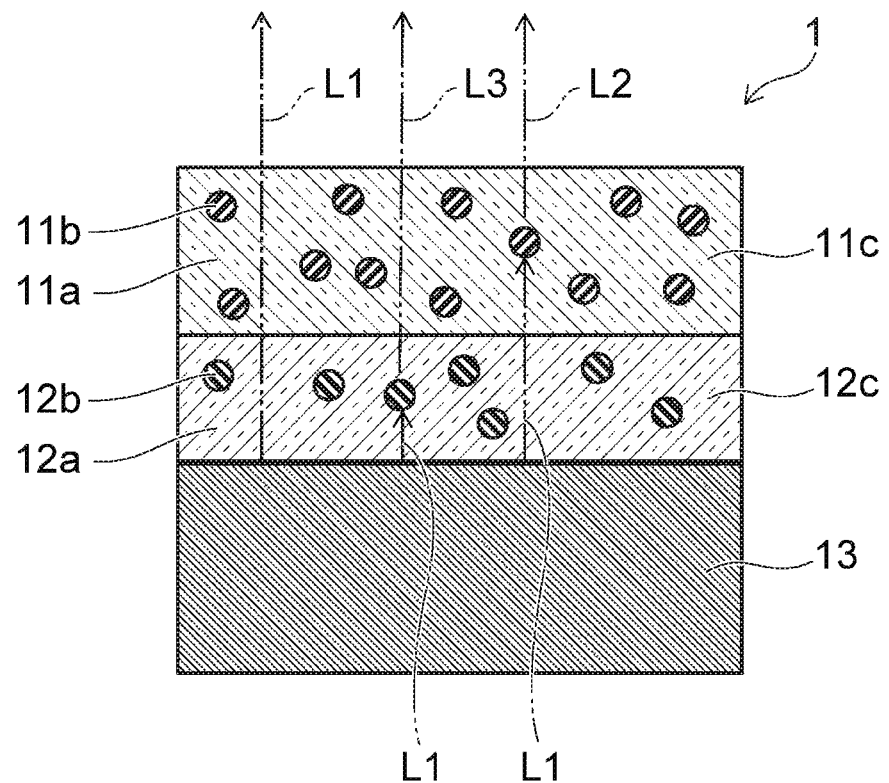
FIG. 7 is a schematic cross-sectional view of the light-emitting device according to the first embodiment.

FIG. 7 is a schematic cross-sectional view of the light-emitting device according to the present embodiment.

A plurality of first phosphor sheets 11 are first provided in Step S1 in FIG. 1 as shown in FIG. 2A. The first phosphor sheets 11 may be provided by manufacturing or purchasing the sheets. As shown in FIG. 2B, a large number of particles of a first phosphor 11b are dispersed in a first base material 11a made of a transparent resin material in each of the first phosphor sheets 11. The first phosphor 11b absorbs first light L1 to emit second light L2. For example, the first light L1 is blue light, and the second light L2 is red light. In an example, the first phosphor 11b is a fluoride phosphor such as KSF ($K_2SiF_6:Mn^{4+}$). Regarding a plurality of first phosphor sheets 11, the thickness of the first phosphor sheet 11, the distribution density of the first phosphor 11b, and the like unavoidably vary.

A plurality of second phosphor sheets 12 are also provided in Step S2 in FIG. 1 as shown in FIG. 3A. The second phosphor sheets 12 may also be provided by manufacturing or purchasing the sheets. As shown in FIG. 3B, a large number of particles of a second phosphor 12b are dispersed in a second base material 12a made of a transparent resin material in each of the second phosphor sheets 12. The second phosphor 12b absorbs the first light L1 to emit third light L3. For example, the third light L3 is green light. In an example, the second phosphor 12b is a β-SiAlON ($Si_{6-z}Al_zO_zN_{8-z}:Eu^{2+}$). Also regarding a plurality of second phosphor sheets 12, the thickness of the second phosphor sheet 12, the distribution density of the second phosphor 12b, and the like unavoidably vary.

Further, a light-emitting element 13 is provided in Step S3 in FIG. 1. The light-emitting element 13 may also be provided by manufacturing or purchasing the light-emitting element. The light-emitting element 13 emits the first light L1. Examples of the light-emitting element 13 include a light-emitting diode (LED). The order of Step S1 of providing a plurality of first phosphor sheets 11, Step S2 of providing a plurality of second phosphor sheets 12, and Step S3 of providing a light-emitting element 13 is not limited to a particular order.

Next, a wavelength conversion characteristic of each of the first phosphor sheets 11 provided in Step S1 is measured in Step S4 in FIG. 1. For example, the chromaticity is measured as an example of the wavelength conversion characteristic. Specifically, a predetermined region of each first phosphor sheet 11 is radiated with excitation light. The excitation light is the first light L1 or light with a peak wavelength close to the peak wavelength of the first light L1. The first phosphor 11b of the first phosphor sheet 11 is thus excited by absorption of the excitation light to emit the second light L2. Accordingly, the first phosphor sheet 11 emits the mixed light of the excitation light and the second light L2. The chromaticity (first chromaticity) of the mixed light is measured. The first chromaticity is, for example, a set of an x value and a y value in the XYZ colorimetric system. The first chromaticity unavoidably varies because of variation in the thickness of the first phosphor sheet 11 and variation in the distribution density of the first phosphor 11b.

Next, the first phosphor sheets 11 are classified according to x value of the first chromaticity in Step S5 in FIG. 1 as shown in FIG. 4A. For example, in the case in which the specification range of the x value of the first phosphor sheet 11 is x1 or more and x2 or less, a criterion value x0 greater than x1 and less than x2 is set. In the case in which the x value of a first phosphor sheet 11 is x1 or more and x0 or less, the first phosphor sheet 11 is classified as a first group G1. On the other hand, in the case in which the x value of another first phosphor sheet 11 is greater than x0 and x2 or less, the first phosphor sheet 11 is classified as a second group G2.

The criterion value x0 can be, for example, the average value of the x values of the first phosphor sheets 11 provided in Step S1. Alternatively, the criterion value x0 may be the intermediate value between the lower limit x1 and the upper limit x2 of the specification range of the x value. That is, x0=(x1+x2)/2 may be employed. Alternatively, the criterion value x0 may be the median of the x values of the first phosphor sheets 11 provided in Step S1.

Similarly, a wavelength conversion characteristic of each of the second phosphor sheets 12 provided in Step S2 is measured in Step S6 in FIG. 1. For example, the chromaticity is measured as an example of the wavelength conversion characteristic. Specifically, a predetermined region of each second phosphor sheet 12 is radiated with excitation light. For example, the same excitation light as the light used for the measurement of the wavelength conversion characteristic of the first phosphor sheet 11 in Step S4 is used as the excitation light. The second phosphor 12b of the second phosphor sheet 12 is thus excited by absorption of the excitation light to emit the third light L3. Accordingly, the second phosphor sheet 12 emits the mixed light of the excitation light and the third light L3. The chromaticity (second chromaticity) of the mixed light is measured. The second chromaticity is, for example, a set of an x value and a y value in the XYZ colorimetric system. The second chromaticity unavoidably varies because of variation in the thickness of the second phosphor sheet 12 and variation in the distribution density of the second phosphor 12b.

Next, the second phosphor sheets 12 are classified according to y value of the second chromaticity in Step S7 in FIG. 1 as shown in FIG. 4B. For example, in the case in which the specification range of the y value of the second phosphor sheet 12 is y1 or more and y2 or less, a criterion value y0 greater than y1 and less than y2 is set. In the case in which the y value of a second phosphor sheet 12 is y1 or more and y0 or less, the second phosphor sheet 12 is classified as a third group G3. On the other hand, in the case in which the y value of another second phosphor sheet 12 is greater than y0 and y2 or less, the second phosphor sheet 12 is classified as a fourth group G4.

The criterion value y0 can be, for example, the average value of the y values of the second phosphor sheets 12 provided in Step S2. Alternatively, the criterion value y0 may be the intermediate value between the lower limit y1 and the upper limit y2 of the specification range of the y value. That is, $y0=(y1+y2)/2$ may be employed. Alternatively, the criterion value y0 may be the median of the y values of the second phosphor sheets 12 provided in Step S2.

Next, a combination of a first phosphor sheet 11 and a second phosphor sheet 12 is selected on the basis of the wavelength conversion characteristic of each first phosphor sheet 11 and the wavelength conversion characteristic of each second phosphor sheet 12 in Step S8 in FIG. 1.

Specifically, a first phosphor sheet 11 classified as the first group G1 in Step S5 and a second phosphor sheet 12 classified as the fourth group G4 in Step S7 are combined as shown in FIG. 5A. Also, a first phosphor sheet 11 classified as the second group G2 in Step S5 and a second phosphor sheet 12 classified as the third group G3 are combined as shown in FIG. 5B.

Next, a plurality of first phosphor pieces 11c and a plurality of second phosphor pieces 12c are respectively obtained from the selected first phosphor sheet 11 and the selected second phosphor sheet 12 in Step S9 in FIG. 1 as shown in FIG. 6. For example, the first phosphor sheet 11 and the second phosphor sheet 12 are layered to form a single sheet, and the sheet is then divided.

Next, in Step S10 in FIG. 1, a second phosphor piece 12c and a first phosphor piece 11c are disposed on the light-emitting element 13 provided in Step S3 as shown in FIG. 7. A light-emitting device 1 is thus manufactured.

In the light-emitting device 1, the second phosphor piece 12c and the first phosphor piece 11c are layered on the light-emitting element 13. The light-emitting element 13 emits, for example, blue first light L1. The second phosphor piece 12c absorbs a portion of the first light L1 to emit, for example, green third light L3. The first phosphor piece 11c absorbs another portion of the first light L1 and a portion of the third light L3 to emit, for example, red second light L2. The light-emitting device 1 therefore emits the mixed light of the first light L1, the second light L2, and the third light L3. The mixed light is, for example, white light.

Next, the effects of the present embodiment will be described.

Figure 8:
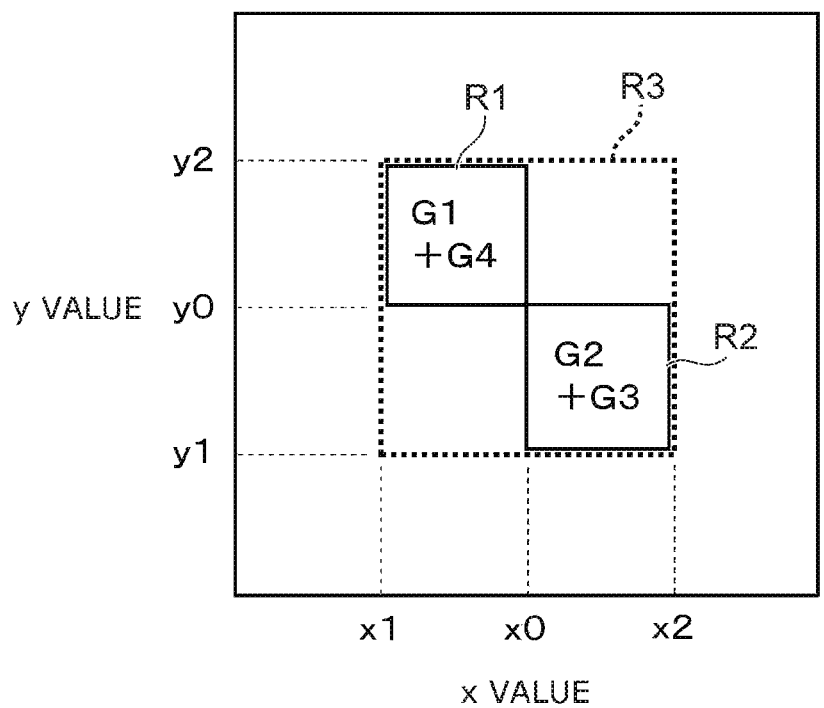
FIG. 8 is an xy chromaticity diagram showing the chromaticity distribution of light emitted from the light-emitting device according to the first embodiment.
Figure 9:
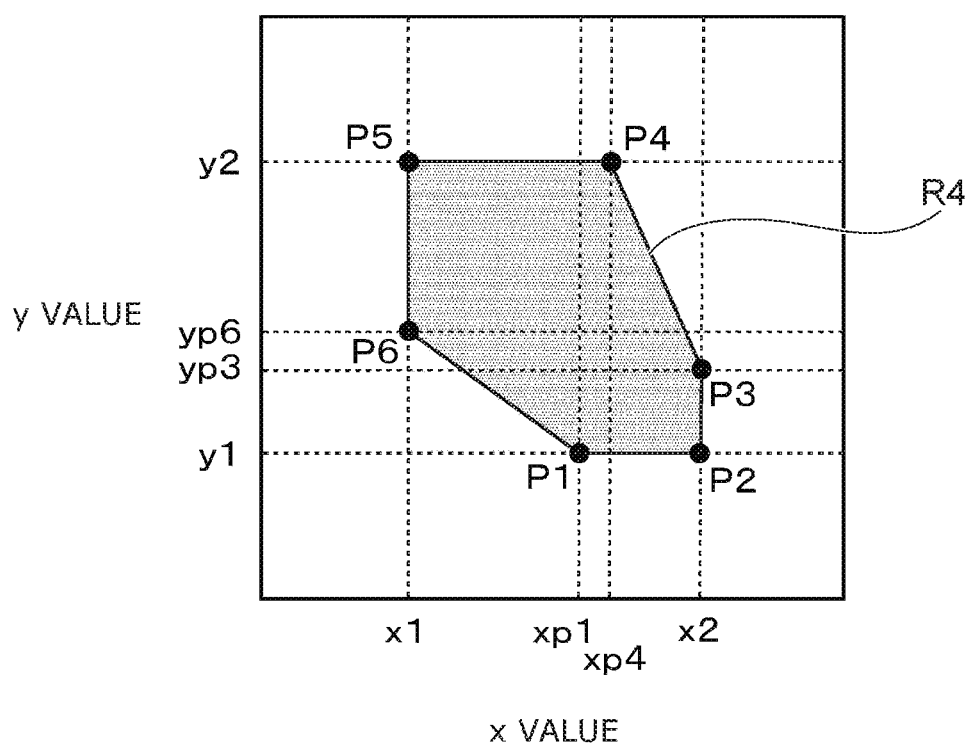
FIG. 9 is an xy chromaticity diagram showing the chromaticity distribution of light emitted from the light-emitting device according to the first embodiment.

FIG. 8 and FIG. 9 are xy chromaticity diagrams showing the chromaticity distributions of light emitted from the light-emitting device according to the present embodiment.

The combination of the first phosphor piece 11c and the second phosphor piece 12c in the light-emitting device 1 is the combination of a first phosphor piece 11c in the first group G1 and a second phosphor piece 12c in the fourth group G4 or the combination of a first phosphor piece 11c in the second group G2 and a second phosphor piece 12c in the third group G3. Hence, the chromaticity coordinates of light emitted from the light-emitting device 1 fall within a region R1 of x values of x1 or more and x0 or less and y values of greater than y0 and y2 or less or within a region R2 of x values of greater than x0 and x2 or less and y values of y1 or more and y0 or less as shown in FIG. 8.

On the other hand, if first phosphor pieces 11c and second phosphor pieces 12c within specification ranges are randomly combined without performing Steps S4 to S8, the chromaticity coordinates of light emitted from the light-emitting device are distributed in a region R3 of x values of x1 or more and x2 or less and y values of y1 or more and y2 or less. In the xy chromaticity diagram, the area of the region R3 is greater than the sum of the area of the region R1 and the area of the region R2. As described above, the range of variation of the chromaticity coordinates of light emitted from the light-emitting device 1 can be reduced in the present embodiment. Accordingly, the characteristics of light emitted from the light-emitting device 1 can be made uniform.

As described above, the criterion value x0 may be the intermediate value between the lower limit x1 and the upper limit x2 of the specification range of the x value. Similarly, the criterion value y0 may be the intermediate value between the lower limit y1 and the upper limit y2 of the specification range of the y value.

As described above, the criterion value x0 may be the median of the x values of the first phosphor sheets 11. Similarly, the criterion value y0 may be the median of the y values of the second phosphor sheets 12. The number of the first phosphor sheets 11 classified as the group G1 can thus be substantially equal to the number of the first phosphor sheets 11 classified as the group G2 when a plurality of first phosphor sheets 11 are classified into the group G1 and the group G2. Similarly, the number of the second phosphor sheets 12 classified as the group G3 can be substantially equal to the number of the second phosphor sheets 12 classified as the group G4 when a plurality of second phosphor sheets 12 are classified into the group G3 and the group G4.

In the case in which the criterion value is the median, the chromaticity coordinates of light emitted from the light-emitting device 1 are distributed in the region R1 and the region R2 as shown in FIG. 8 if the distribution of the x values shown in FIG. 4A and the distribution of the y values shown in FIG. 4B are normal distributions. However, in the case in which the distributions of the x values and the y values are not normal distributions but are distorted distributions, the chromaticity coordinates of light emitted from the light-emitting device 1 fall within a hexagonal region R4 with a first point P1 (xp1,y1), a second point P2 (x2,y1), a third point P3 (x2,yp3), a fourth point P4 (xp4,y2), a fifth point P5 (x1,y2), and a sixth point P6 (x1,yp6) at its vertices in the xy chromaticity diagram as shown in FIG. 9. The values xp1 and xp4 are greater than x1 and less than x2 and are not necessarily the intermediate value between the lower limit x1 and the upper limit x2. The values yp3 and yp6 are greater than y1 and less than y2 and are not necessarily the intermediate value between the lower limit y1 and the upper limit y2. Also in this case, the characteristics of light emitted from the light-emitting device 1 can be more uniform than in the case in which first phosphor pieces 11c and second phosphor pieces 12c are randomly combined.

First Modified Example of First Embodiment

Figure 10A:
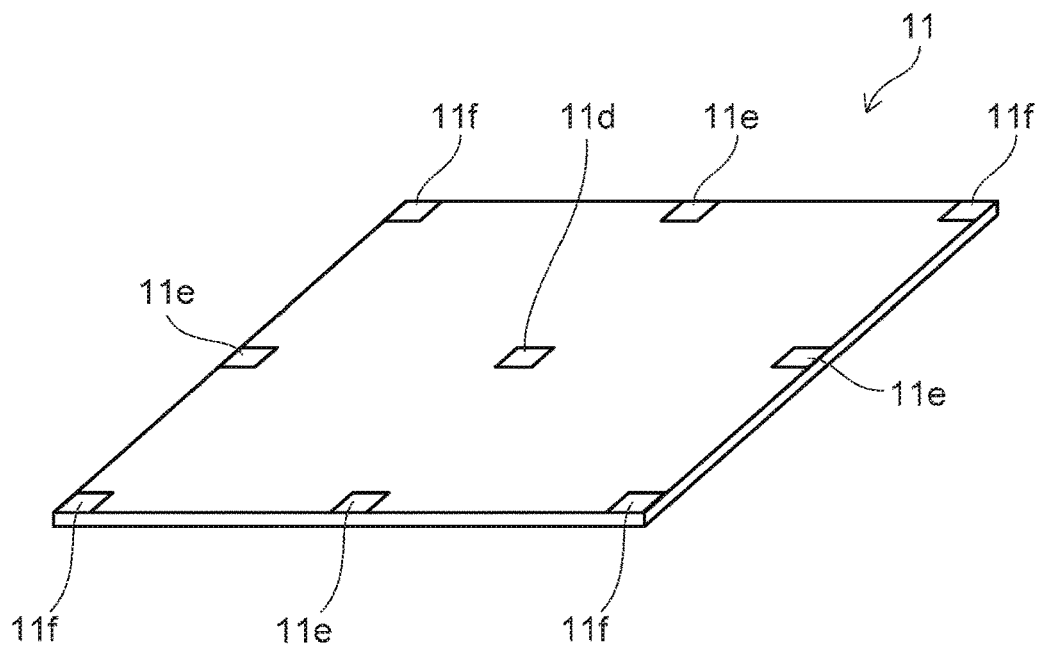
FIG. 10A schematically shows a method of manufacturing a light-emitting device according to a first modified example of the first embodiment.
Figure 10B:
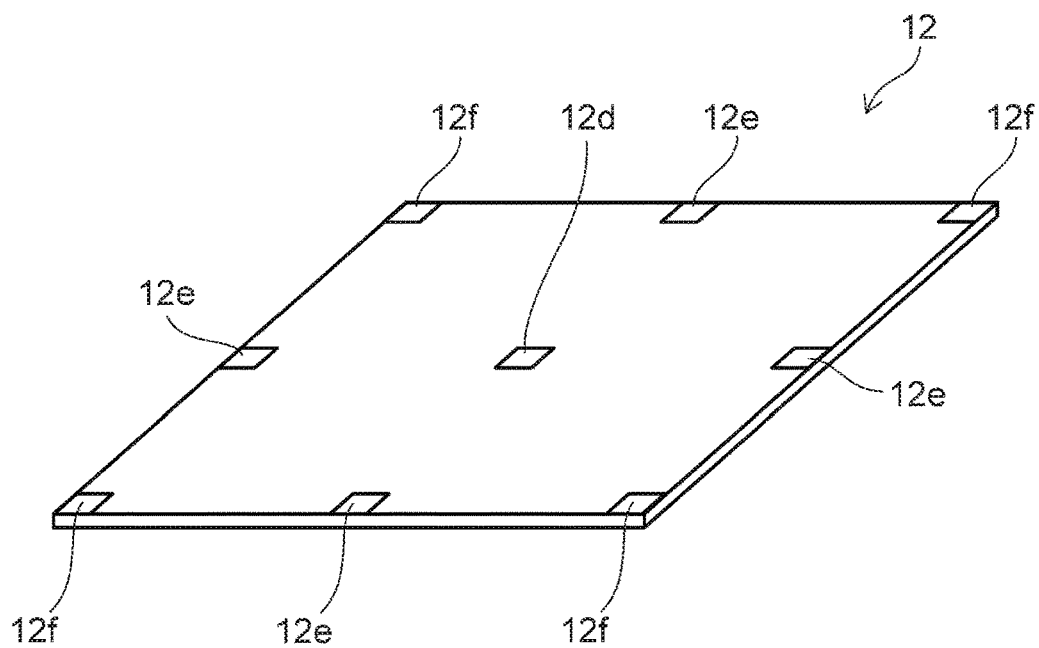
FIG. 10B schematically shows the method of manufacturing a light-emitting device according to the first modified example of the first embodiment.

FIG. 10A and FIG. 10B schematically show a method of manufacturing a light-emitting device according to the present modified example.

The first chromaticities in a plurality of regions of each first phosphor sheet 11 as shown in FIG. 10A are measured, and the average value of the first chromaticities in the regions is assumed to be the first chromaticity of the first phosphor sheet 11 in Step S4 of measuring first chromaticities of the first phosphor sheets 11 in FIG. 1 in the present modified example.

For example, a total of nine regions consisting of a central portion 11d, middle portions 11e of the four sides, and four corners 11f of a single first phosphor sheet 11 are radiated with the excitation light to measure the chromaticity in each region. The average value of the measured values is assumed to be the chromaticity (first chromaticity) of the first phosphor sheet 11.

Similarly, the second chromaticities in a plurality of regions of each second phosphor sheet 12 as shown in FIG. 10B are measured, and the average value of the second chromaticities in the regions is regarded as the second chromaticity of the second phosphor sheet 12 in Step S6 of measuring second chromaticities of the second phosphor sheets 12 in FIG. 1.

For example, a total of nine regions consisting of a central portion 12d, middle portions 12e of the four sides, and four corners 12f of a single second phosphor sheet 12 are radiated with the excitation light to measure the chromaticity in each region. The average value of the measured values is assumed to be the chromaticity (second chromaticity) of the second phosphor sheet 12.

The first chromaticity can be determined in consideration of variation in chromaticity in each first phosphor sheet 11 in the present modified example. The same applies to the second chromaticity. Accordingly, variation in wavelength conversion characteristics of light emitted from the light-emitting device can be more effectively reduced.

The positions of the regions of the first phosphor sheet 11 in which the first chromaticities are measured are not limited to the above example. The number of the regions of the first phosphor sheet 11 in which the chromaticities are measured is not limited to nine but may be eight or less or ten or more. Similarly, the positions of the regions of the second phosphor sheet 12 in which the second chromaticities are measured and the number of the regions is not limited to the above example.

Second Modified Example of First Embodiment

Figure 11:
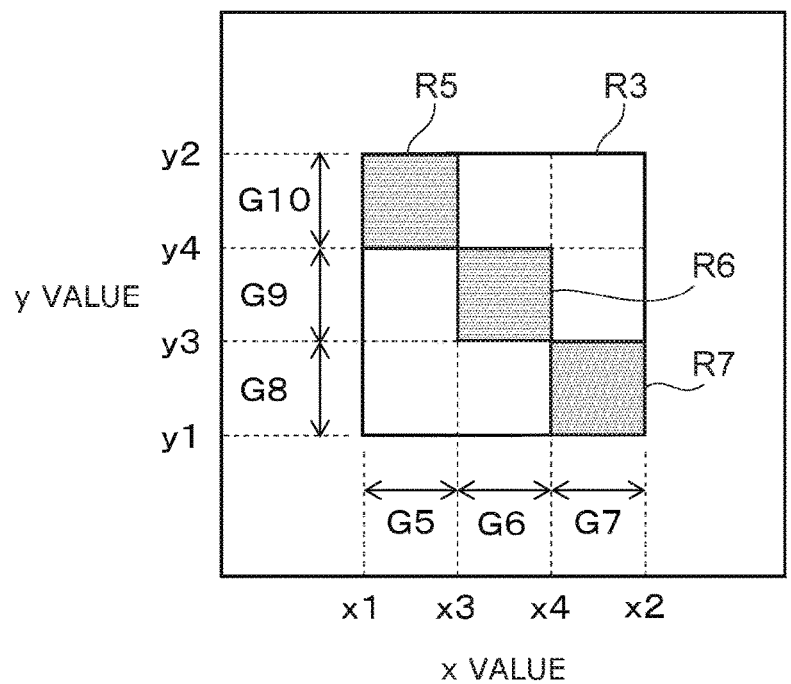
FIG. 11 is an xy chromaticity diagram for a method of selecting the first phosphor sheet and the second phosphor sheet in a second modified example of the first embodiment.

FIG. 11 is an xy chromaticity diagram for a method of selecting the first phosphor sheet and the second phosphor sheet in the present modified example.

In the present modified example, a plurality of first phosphor sheets 11 are classified into three groups G5, G6, and G7 in ascending order of the x value as shown in FIG. 11. For example, a first phosphor sheet 11 with an x value of x1 or more and x3 or less is classified as the group G5, a first phosphor sheet 11 with an x value of greater than x3 and x4 or less is classified as the group G6, and a first phosphor sheet 11 with an x value of greater than x4 and x2 or less is classified as the group G7. The numbers of the first phosphor sheets 11 in the respective groups are made as nearly equal as possible. A plurality of second phosphor sheets 12 are classified into three groups G8, G9, and G10 in ascending order of they value. For example, a second phosphor sheet 12 with a y value of y1 or more and y3 or less is classified as the group G8, a second phosphor sheet 12 with a y value of greater than y3 and y4 or less is classified as the group G9, and a second phosphor sheet 12 with a y value of greater than y4 and y2 or less is classified as the group G10. The numbers of the second phosphor sheets 12 in the respective groups are made as nearly equal as possible.

The first phosphor sheet 11 classified as the group G5 is combined with the second phosphor sheet 12 classified as the group G10, the first phosphor sheet 11 classified as the group G6 is combined with the second phosphor sheet 12 classified as the group G9, and the first phosphor sheet 11 classified as the group G7 is combined with the second phosphor sheet 12 classified as the group G8. Variation in chromaticity of light emitted from the light-emitting device can thus fall within the regions R5, R6, and R7. As described above, variation in wavelength conversion characteristics of light emitted from the light-emitting device can be reduced better in the present modified example than in the first embodiment.

The first phosphor sheets 11 and the second phosphor sheets 12 are classified into two groups each in the first embodiment, and the first phosphor sheets 11 and the second phosphor sheets 12 are classified into three groups each in the present modified example, but this classification is not limiting. The phosphor sheets may be classified into four or more groups.

More generally, the first phosphor sheets 11 can be classified into n groups $G11\_1$ to $G11\_n$ in ascending order of the x value, and the second phosphor sheets 12 can be classified into n groups $G12\_1$ to $G12\_n$ in ascending order of the y value, n being an integer of two or more, and k being an integer of one or more and nor less. In this case, a first phosphor sheet 11 classified as a group $G11\_k$ is combined with a second phosphor sheet 12 classified as a group $G12\_{n-k+1}$. The region of variation in the xy chromaticity diagram can thus be reduced to about (1/n) times compared with the case in which the first phosphor sheets 11 and the second phosphor sheets 12 are randomly combined.

In this case, the value of n may be equal to the number of the first phosphor sheets 11 and the number of the second phosphor sheets 12. That is, each first phosphor sheet 11 may constitute a group, and each second phosphor sheet 12 may constitute a group. This case is equivalent to the case in which a first phosphor sheet 11 is combined with a second phosphor sheet 12 without grouping.

Specifically, n first phosphor sheets 11 and n second phosphor sheets 12 are provided. Let $x_1, x_2, \ldots, x_k, \ldots, x_n$ be the x values of the first phosphor sheets 11 in ascending order, and let $y_1, y_2, \ldots, y_k, y_n$, be the y values of the second phosphor sheets 12 in ascending order. A first phosphor sheet 11 with an x value of $x_1$ is combined with a second phosphor sheet 12 with a y value of $y_n$, a first phosphor sheet 11 with an x value of $x_2$ is combined with a second phosphor sheet 12 with a y value of $y_{n-1}$, and a first phosphor sheet 11 with an x value of $x_n$ is combined with a second phosphor sheet 12 with a y value of $y_1$. Generally, a first phosphor sheet 11 with an x value of $x_k$ is combined with a second phosphor sheet 12 with a y value of $y_{n-k+1}$.

Figure 12:
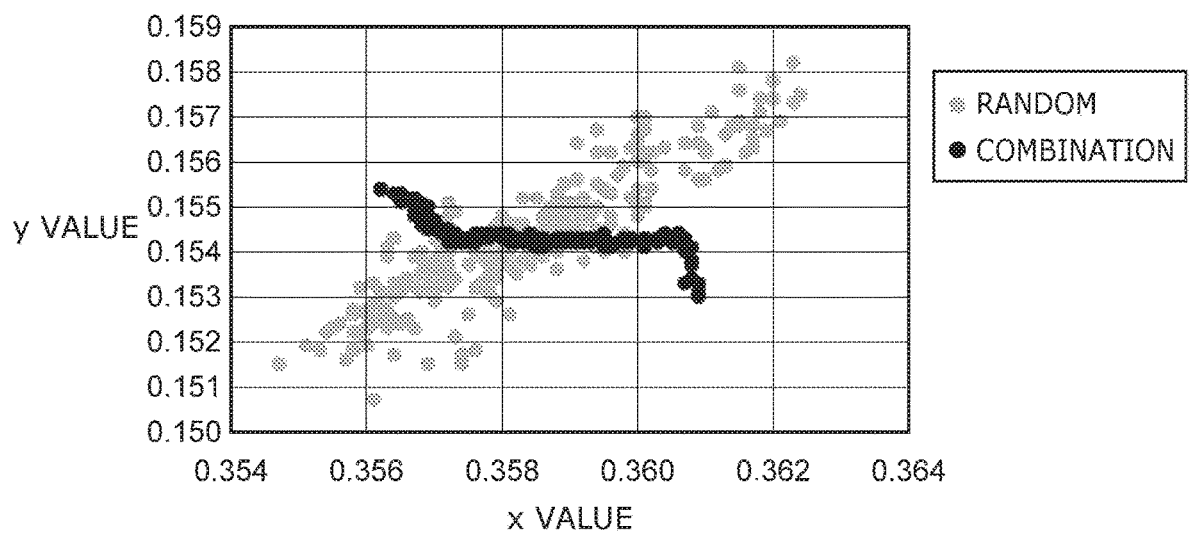
FIG. 12 is an xy chromaticity diagram showing simulation results in the case in which the first phosphor sheets and the second phosphor sheets are respectively combined.

FIG. 12 is an xy chromaticity diagram showing simulation results in the case in which the first phosphor sheets 11 and the second phosphor sheets 12 are classified and respectively combined.

In the case in which the first phosphor sheets 11 are randomly combined with the second phosphor sheets 12, the chromaticities of light emitted from the light-emitting devices were scattered two-dimensionally in the xy chromaticity diagram as shown in FIG. 12. On the other hand, in the case in which the first phosphor sheets 11 and the second phosphor sheets 12 were respectively combined as described above, the chromaticities of light emitted from the light-emitting devices were gathered in a line.

Second Embodiment

Figure 13:
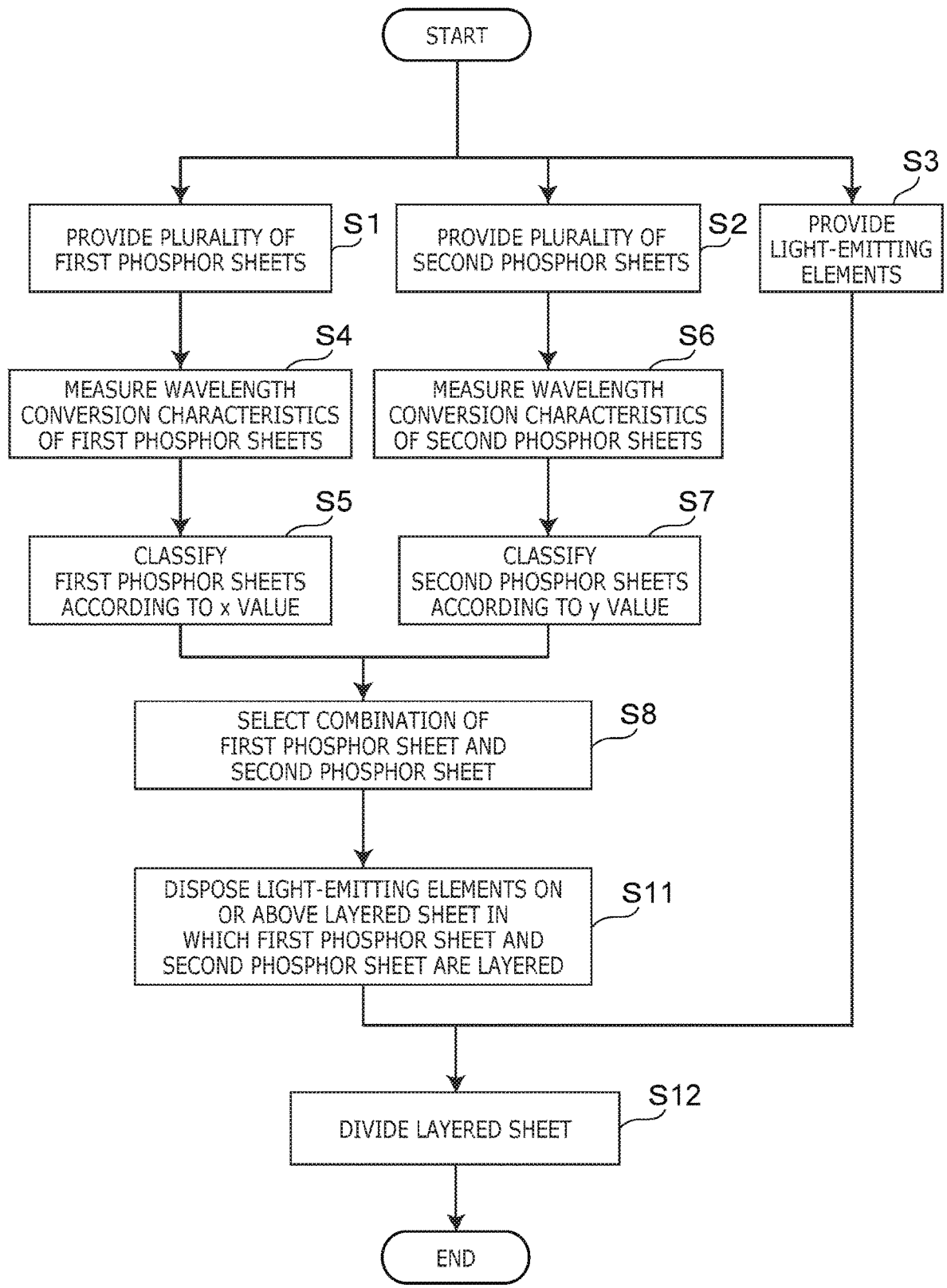
FIG. 13 is a flowchart of a method of manufacturing a light-emitting device according to a second embodiment.

FIG. 13 is a flowchart of a method of manufacturing a light-emitting device according to the present embodiment.

Figure 14A:
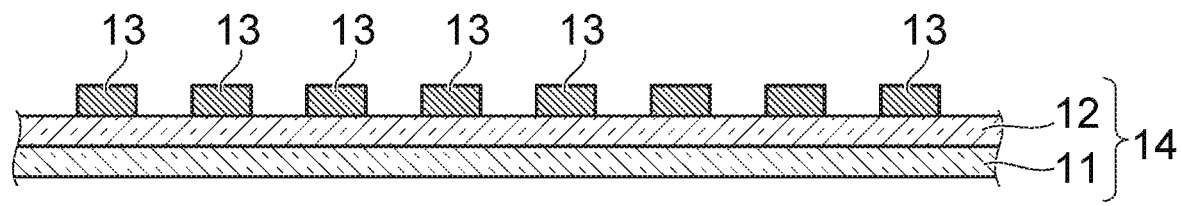
FIG. 14A is a schematic cross-sectional view for illustrating the method of manufacturing a light-emitting device according to the second embodiment.
Figure 14B:
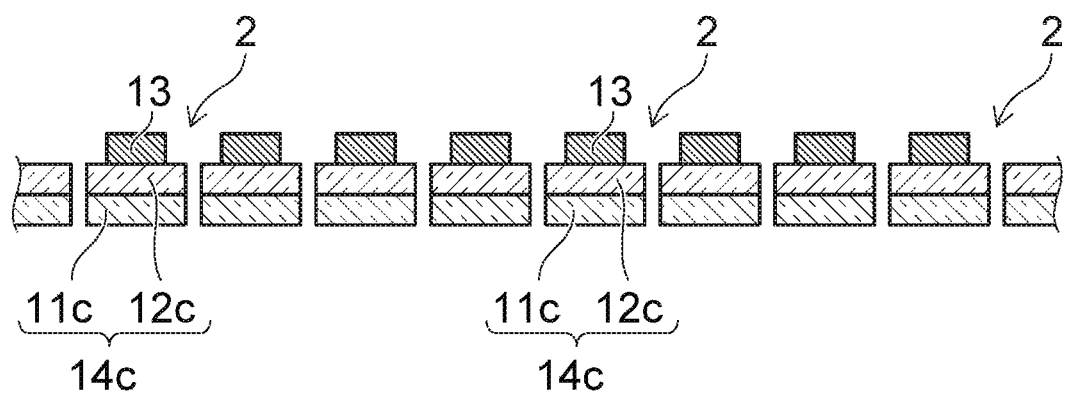
FIG. 14B is a schematic cross-sectional view for illustrating the method of manufacturing a light-emitting device according to the second embodiment.

FIG. 14A and FIG. 14B are schematic cross-sectional views for illustrating the method of manufacturing a light-emitting device according to the present embodiment.

Steps S1 to S8 are performed similarly to the first embodiment as shown in FIG. 13.

Next, the first phosphor sheet 11 and the second phosphor sheet 12 selected in Step S8 are layered to produce a layered sheet 14 in Step S11 in FIG. 13 as shown in FIG. 14A. A plurality of light-emitting elements 13 are disposed on the layered sheet 14. The light-emitting elements 13 are disposed, for example, on an adhesive disposed on the layered sheet 14.

Next, the layered sheet 14 are divided into a plurality of layered pieces 14c in Step S12 in FIG. 13 as shown in FIG. 14B. At this time, one or more light-emitting elements 13 are allowed to be on each layered piece 14c. For example, the layered sheet 14 is divided in units of light-emitting elements 13. In this case, one light-emitting element 13 is disposed on one layered piece 14c. A plurality of light-emitting devices 2 according to the present embodiment are thus manufactured at a time. In each light-emitting device 2, the light-emitting element 13 is disposed on the layered piece 14c in which the phosphor piece 11c and the phosphor piece 12c are layered.

Third Embodiment

Figure 15:
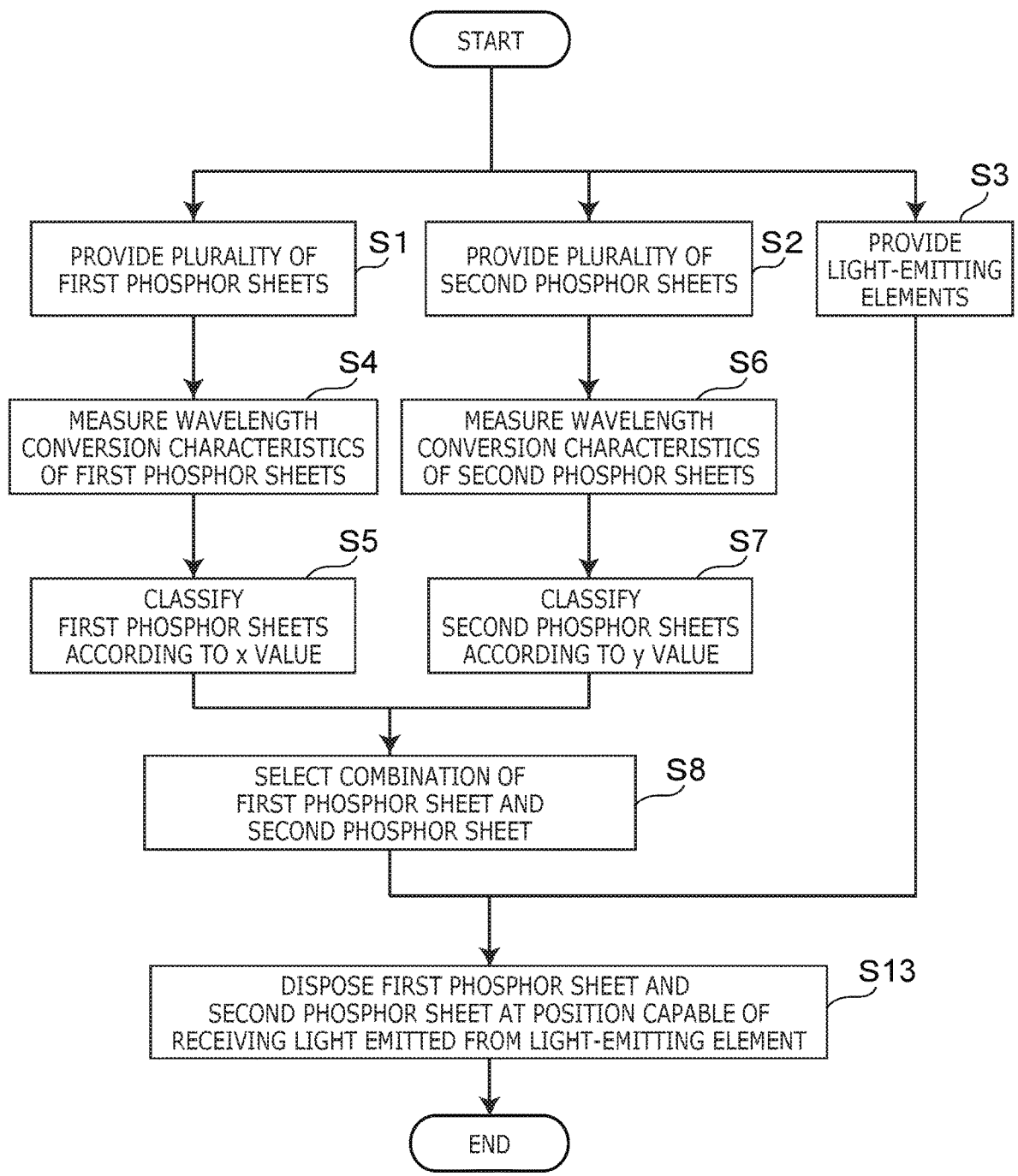
FIG. 15 is a flowchart of a method of manufacturing a light-emitting device according to a third embodiment.

FIG. 15 is a flowchart of a method of manufacturing a light-emitting device according to the present embodiment.

Figure 16:
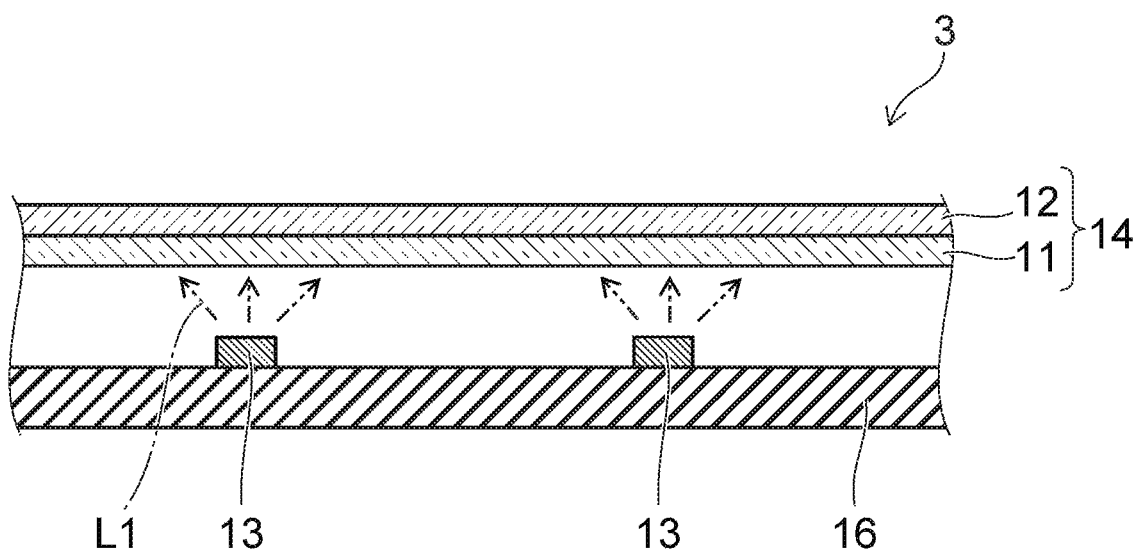
FIG. 16 is a schematic cross-sectional view of the light-emitting device according to the third embodiment.

FIG. 16 is a schematic cross-sectional view of the light-emitting device according to the present embodiment.

Steps S1 to S8 are performed similarly to the first embodiment as shown in FIG. 15.

Next, the first phosphor sheet 11 and the second phosphor sheet 12 selected in Step S8 are disposed at a position capable of receiving the first light L1 emitted from the light-emitting element 13 in Step S13 in FIG. 15 as shown in FIG. 16. For example, a plurality of light-emitting elements 13 are mounted on a mounting board 16. The layered sheet 14 in which the first phosphor sheet 11 and the second phosphor sheet 12 are layered is disposed above the mounting board 16. A light-emitting device 3 according to the present embodiment is thus manufactured.

In the light-emitting device 3, the mounting board 16 on which the light-emitting elements 13 have been mounted may be integrated with the layered sheet 14 or disposed as a separate member. The layered sheet 14 is only required to be disposed at a position where the first light L1 emitted from the light-emitting elements 13 enters.

In the above embodiments and modified examples, the x values and the y values in the XYZ colorimetric system are used as parameters indicating the wavelength conversion characteristics, but these parameters are not limiting. For example, r values and g values in the RGB colorimetric system may be used as parameters indicating the wavelength conversion characteristics.

The following describes specific examples of each member used in the method of manufacturing a light-emitting device according to each embodiment.

Light-Emitting Element

Examples of the light-emitting element 13 include an LED chip. The light-emitting element 13 can have, for example, a semiconductor layered structure containing a nitride semiconductor ($In_xAl_yGa_{1-x-y}N$, where $0 \leq x$, $0 \leq y$, and $x+y \leq 1$), which can emit ultraviolet to visible light. The peak emission wavelength of the light-emitting element 13 is preferably 400 nm or more and 530 nm or less, more preferably 420 nm or more and 490 nm or less, further preferably 450 nm or more and 475 nm or less, in consideration of the light-emission efficiency of the light-emitting device 1, the excitation spectrum of the phosphor, and the color mixing performance. The light-emitting device 1 may include a single light-emitting element 13 or two or more light-emitting elements 13. The light-emitting element 13 preferably shows a half-width of 40 nm or less, more preferably 30 nm or less. Light emitted from the light-emitting element 13 can thus easily have a sharp peak. Accordingly, for example, in the case in which the light-emitting device is used for a light source for a liquid-crystal display, the liquid-crystal display can achieve good color reproducibility. A plurality of light-emitting elements can be electrically connected in series or in parallel, or in combination of series connections and parallel connections.

The light-emitting element 13 may have any appropriate shape in a plan view, and may have a square shape or an elongated rectangular shape in a plan view. The light-emitting element 13 may have a hexagonal shape or another polygonal shape in a plan view. The light-emitting element 13 includes a pair of positive and negative electrodes. The positive and negative electrodes can be made of gold, silver, copper, tin, platinum, rhodium, titanium, aluminum, tungsten, palladium, nickel, or an alloy of these metals. The lateral surfaces of the light-emitting element 13 may be perpendicular to the upper surface of the light-emitting element 13 or may be inclined inward or outward.

First Phosphor Sheet and Second Phosphor Sheet

Materials that transmit light emitted from the light-emitting element 13 are used for the base materials of the first phosphor sheets 11 and the second phosphor sheets 12. In the present specification, the term "transmit" indicates that the light transmittance at the peak emission wavelength of the light-emitting element 13 is 60% or more, preferably 70% or more, more preferably 80% or more. Examples of the base materials of the first phosphor sheets 11 and the second phosphor sheets 12 include silicone resins, epoxy resins, phenolic resins, polycarbonate resins, acrylic resins, and modified resins of these resins. A silicone resin or an epoxy resin, which has good resistance to heat and light, is particularly suitable. Examples of the silicone resin include dimethyl silicone resins, phenyl-methyl silicone resins, and diphenyl silicone resins.

The first phosphor sheets 11 and the second phosphor sheets 12 may contain light-diffusing particles. Examples of the light-diffusing particles include silicon oxide, aluminum oxide, zirconium oxide, and zinc oxide. One of these light-diffusing particles can be used singly, or two or more of these light-diffusing particles can be used in combination. Silicon oxide, which has a small linear expansion coefficient, is particularly preferably used for the light-diffusing particles. Nanoparticles are preferably used for the light-diffusing particles. Scattering of light emitted from the light-emitting element is thus increased, so that the amount of the phosphor to be used can be reduced. The term "nanoparticles" refers to particles having particle diameters of 1 nm or more and 100 nm or less. The particle diameter in the present specification is mainly defined as D$50$.

The first phosphor sheets 11 and the second phosphor sheets 12 contain phosphors. The phosphors absorb at least a portion of primary light emitted from the light-emitting element 13 and emit secondary light having wavelengths different from wavelengths of the primary light. One of the phosphors described below can be used singly, or two or more of the phosphors described below can be used in combination.

Examples of the phosphor include yttrium-aluminum-garnet based phosphors (for example, $Y_3(Al,Ga)_5O_{12}$:Ce), lutetium-aluminum-garnet based phosphors (for example, $Lu_3(Al,Ga)_5O_{12}$:Ce), terbium-aluminum-garnet based phosphors (for example, $Tb_3(Al,Ga)_5O_{12}$:Ce), silicate based phosphors (for example, $(Ba,Sr)_2SiO_4$:Eu), chlorosilicate based phosphors (for example, $Ca_8Mg(SiO_4)_4Cl_2$:Eu), β-SiAlON based phosphors (for example, $Si_{6-z}Al_zO_zN_{8-z}$:Eu ($0<z<4.2$)), SGS based phosphors (for example, $SrGa_2S_4$:Eu), alkaline earth aluminate based phosphors (for example, $(Ba,Sr,Ca)Mg_xAl_{10}O_{17-x}$:Eu,Mn), α-SiAlON based phosphors (for example, $M_z(Si,Al)_{12}(O,N)_{16}$ (where $0<z≤2$, and M is Li, Mg, Ca, Y, or a lanthanoid element except for La and Ce), nitrogen-containing calcium aluminosilicate based phosphors (for example, $(Sr,Ca)AlSiN_3$:Eu), and manganese-activated fluoride based phosphors (phosphors represented by the general formula (I) $A_2[M_{1-a}Mn_aF_6]$, where "A" is at least one selected from the group consisting of K, Li, Na, Rb, Cs, and $NH_4$, M is at least one element selected from the group consisting of group IV elements and group XIV elements, and "a" satisfies $0<a<0.2$). The peak emission wavelength of an yttrium-aluminum-garnet based phosphor can be shifted to a longer wavelength by substituting a portion of Y with Gd. Typical examples of the manganese-activated fluoride based phosphors include manganese-activated potassium fluorosilicate phosphors (for example, $K_2SiF_6$:Mn).

INDUSTRIAL APPLICABILITY

The present invention can be used for, for example, a light source of an illumination device or a display device.

The invention claimed is:

1. A method of manufacturing a light-emitting device, the method comprising:
   providing a plurality of first phosphor sheets;
   providing a plurality of second phosphor sheets;
   providing a light-emitting element;
   selecting a combination of one of the first phosphor sheets and one of the second phosphor sheets based on a wavelength conversion characteristic of each of the first phosphor sheets and a wavelength conversion characteristic of each of the second phosphor sheets;
   obtaining a plurality of first phosphor pieces and a plurality of second phosphor pieces from the selected first phosphor sheet and the selected second phosphor sheet; and
   disposing one of the first phosphor pieces and one of the second phosphor pieces on or above the light-emitting element.

2. The method of manufacturing a light-emitting device according to claim 1, the method further comprising:
   a first measurement step of measuring the wavelength conversion characteristic of each of the plurality of first phosphor sheets; and
   a second measurement step of measuring the wavelength conversion characteristic of each of the plurality of second phosphor sheets.

3. The method of manufacturing a light-emitting device according to claim 2,
   wherein the first measurement step comprises radiating the first phosphor sheets with excitation light and measuring a first chromaticity of mixed light of the excitation light and light emitted from each of the first phosphor sheets, and
   wherein the second measurement step comprises radiating the second phosphor sheets with the excitation light and measuring a second chromaticity of mixed light of the excitation light and light emitted from each of the second phosphor sheets.

4. The method of manufacturing a light-emitting device according to claim 3,
   wherein, in the step of measuring a first chromaticity, the first chromaticity of each of a plurality of regions of each of the first phosphor sheets is measured, and an average value of the first chromaticities of the plurality of regions is used as a first chromaticity of the first phosphor sheet, and
   wherein, in the step of measuring a second chromaticity, the second chromaticity of each of a plurality of regions of each of the second phosphor sheets is measured, and an average value of the second chromaticities of the plurality of regions is used as a second chromaticity of the second phosphor sheet.

5. The method of manufacturing a light-emitting device according to claim 3, the method further comprising:
   a first classification step of classifying the first phosphor sheets according to x value of the first chromaticity; and
   a second classification step of classifying the second phosphor sheets according to y value of the second chromaticity.

6. The method of manufacturing a light-emitting device according to claim 5,
   wherein, in the first classification step, each of the first phosphor sheets is classified as a first group in a case in which an x value of the first phosphor sheet is not greater than a criterion value of the x value and is classified as a second group in a case in which the x value of the first phosphor sheet is greater than the criterion value of the x value, and
   wherein, in the second classification step, each of the second phosphor sheets is classified as a third group in a case in which a y value of the second phosphor sheet is not greater than a criterion value of the y value and is classified as a fourth group in a case in which the y value of the second phosphor sheet is greater than the criterion value of the y value.

7. The method of manufacturing a light-emitting device according to claim 6, wherein, in the selection step, the first phosphor sheet classified as the first group is combined with the second phosphor sheet classified as the fourth group, and the first phosphor sheet classified as the second group is combined with the second phosphor sheet classified as the third group.

8. The method of manufacturing a light-emitting device according to claim 6, wherein the criterion value of the x value is an average value of x values of the plurality of first phosphor sheets, and wherein the criterion value of the y value is an average value of y values of the plurality of second phosphor sheets.

9. The method of manufacturing a light-emitting device according to claim 6, wherein the criterion value of the x value is a median of x values of the plurality of first phosphor sheets, and wherein the criterion value of the y value is a median of y values of the plurality of second phosphor sheets.

10. The method of manufacturing a light-emitting device according to claim 6, wherein the criterion value of the x value is an intermediate value between a lower limit and an upper limit of a specification range of the x value of the first phosphor sheet, and wherein the criterion value of the y value is an intermediate value between a lower limit and an upper limit of a specification range of the y value of the second phosphor sheet.

11. The method of manufacturing a light-emitting device according to claim 10, wherein chromaticity coordinates of light emitted from the light-emitting device fall within a hexagonal region with a first point (xp1,y1), a second point (x2,y1), a third point (x2,yp3), a fourth point (xp4,y2), a fifth point (x1,y2), and a sixth point (x1,yp6) at vertices in an xy chromaticity diagram, wherein the specification range of the x value of the first phosphor sheet is x1 or more and x2 or less, wherein the specification range of the y value of the second phosphor sheet is y1 or more and y2 or less, wherein xp1 and xp4 are values greater than x1 and less than x2, and wherein yp3 and yp6 are values greater than y1 and less than y2.

12. The method of manufacturing a light-emitting device according to claim 5, wherein, in the first classification step, the first phosphor sheets are classified into n groups in ascending order of the x values, wherein, in the second classification step, the second phosphor sheets are classified into n groups in ascending order of the y values, wherein, in the selection step, one of the first phosphor sheets classified as a k-th group is combined with one of the second phosphor sheets classified as a (n−k+1)th group, wherein n is an integer of 2 or more, and wherein k is an integer of 1 or more and n or less.

13. The method of manufacturing a light-emitting device according to claim 1, wherein each of the first phosphor pieces comprise:
a first base material comprising a resin material; and
a first phosphor mixed in the first base material, wherein each of the second phosphor pieces comprise:
a second base material comprising a resin material; and
a second phosphor mixed in the second base material, wherein the light-emitting element emits first light, wherein the first phosphor absorbs the first light to emit second light, and wherein the second phosphor absorbs the first light to emit third light.

14. The method of manufacturing a light-emitting device according to claim 13, wherein the first light is blue, wherein the second light is red, and wherein the third light is green.

* * * * *